United States Patent [19]

Sibeud

[11] Patent Number: 4,694,372
[45] Date of Patent: Sep. 15, 1987

[54] CIRCUIT DIAGNOSIS AND CONTROL DEVICE

[76] Inventor: Jean-Paul Sibeud, Chaponnay (rhone), France

[21] Appl. No.: 744,297

[22] Filed: Jun. 13, 1985

Related U.S. Application Data

[63] Continuation of Ser. No. 444,568, Nov. 26, 1982, abandoned.

[30] Foreign Application Priority Data

Nov. 25, 1981 [FR] France .................. 81 22454

[51] Int. Cl.$^4$ .............................. H02H 3/24
[52] U.S. Cl. ........................ 361/86; 361/88; 361/90; 361/101; 340/660
[58] Field of Search ............... 361/86, 88, 91, 90, 361/92, 101, 75; 364/483, 482; 307/10 R, 10 LS, 10 BP, 10 A; 340/79, 80, 81 R, 690, 651, 660–663, 665, 52 F

[56] References Cited

U.S. PATENT DOCUMENTS

| | | | |
|---|---|---|---|
| 4,196,475 | 4/1980 | Hall | 364/482 |
| 4,271,402 | 6/1981 | Kastura et al. | 307/10 R X |
| 4,287,503 | 9/1981 | Sumida | 307/10 R X |
| 4,438,422 | 3/1984 | Nojiri et al. | 340/52 F |
| 4,441,136 | 4/1984 | Hampshire | 361/88 |

Primary Examiner—A. D. Pellinen
Assistant Examiner—Todd E. De Boer
Attorney, Agent, or Firm—Remy J. VanOphem

[57] ABSTRACT

A circuit diagnosis and control device adapted to detect defects in a primary electrical circuit and temporarily discontinue power to the primary circuit in the event of a defect. A MOS transistor is connected in series with the power source and the primary circuit. A calculation device is connected with the MOS transistor and periodically tests a first voltage $V_{GS}$, which may be different from zero, and a second voltage $V_{DS}$, which must be higher than half of the voltage $V_{BAT}$ of the battery. In the event of a short circuit, the power is temporarily withheld from the primary circuit. An indication lamp may be controlled by the calculation device to inform the driver of the circuit condition. If $V_{GS}$ is not equal to zero and $V_{DS}$ is half of $V_{BAT}$, a short circuit condition is indicated, for example, by a slow flashing of the indicator lamp. If $V_{GS}$ is equal to zero and $V_{DS}$ is less than half of $V_{BAT}$, an open circuit condition is indicated, for example, by a rapid flashing of the indicator lamp. During normal operation, the indicator lamp remains continuously lit.

14 Claims, 7 Drawing Figures

CIRCUIT DIAGNOSIS AND CONTROL DEVICE

This is a continuation of application Ser. No. 444,568, filed Nov. 26, 1982, now abandoned.

BACKGROUND OF THE INVENTION

The invention relates to electrical circuits on automobile vehicles. It concerns in particular lighting circuits, the good operation inspection of which is a circulation safety factor. The short circuit risks of these circuits are important due to the geographical dispersion of controlled instruments on the vehicle.

The system that is offered provides safety at the circulation level because the driver is immediately warned of any lighting defect and at the level of the vehicle circuits which are not subject to destruction by fire in case of a short circuit. In addition, the method that is used, that is, inspection by a calculator, allows the realization of a sequential control, the principal advantage of which is to reduce the number of controls on the dashboard and to simplify the contruction, the repair, and the use of the vehicle.

The uses of the safety switch of the present invention are not limited to the lighting system; on the contrary, all the auxiliary electrical motors of the vehicle can be controlled through this method which, by its detection of short circuits and its maximum current limitation, avoids the overheating of motors that are fed when their shaft is mechanically locked. This allows suppression of the usual electrical safety devices, that is, limit switches or mechanical switches, and torque limiting devices.

The present invention is directed to solving several problems. The object of the present invention is to permit controlling the application of voltage or the isolation of a circuit regardless of its condition without modification of the components of the installation.

Another object of the present invention is to detect the condition of the controlled circuit, which may be either normal, open or short-circuited.

Still another object of the present invention is to report the condition of the circuit by a simple means allowing observation of whether the circuit is operating normally, whether it is open, or whether it is short-circuited. This may be obtained by providing a constantly lit warning light or flasher according to different sequences.

Yet another object of the present invention is to perform a safety function. The safety function includes limiting the current and periodically isolating and testing the short-circuited circuit. This safety function prevents the deterioration of the circuit and of its components. Thus, a circuit bearing hazardous short circuit is not rendered useless. As soon as the short circuit disappears, normal current supply is restored. Similarly, limiting the maximum current with the stated safety features presents certain advantages for incandescent lamp filaments, such as the reduction of thermal shocks and for electrical motors which are automatically provided with maximum torque limitation, maximum acceleration and locked induced heating.

On the other hand, the permanent inspection of circuits through a microprocessor which is contemplated by this system will facilitate all the applications of sequential control that can be considered.

The devices known to this day generally have only the following limited features. Control is obtained through a switch handled by the user. This control is either direct or indirect, which is to say that it acts through an electromagnetic relay on the power circuit. Safety is obtained through fuses in series or through a thermal circuit breaker. In some instances, no safety feature is planned. Defect reporting is obtained through a repeating warning light in some cases, such as for turn signal indicators. The checking of open circuits can also be accomplished during the rest period of these circuits by having a very weak current circulate there. This problem has so far received only elementary and partial solutions.

These known devices have several disadvantages relating to both control and safety.

For example, the ignition of an incandescent lamp, the filament of which is cold, provokes a current flash which is 50 to 100 times higher than the nominal current. This causes extensive wear of the switches that are used. Many switches and associated circuits are incapable of withstanding the elevated short-circuited current. To make the devices usable by the driver, it is necessary to regroup all these switches on an instrument cluster. These electromechanical systems are expensive, fragile and cumbersome. There remains, however, in addition to the instrument cluster, a large number of other switches on the dashboard, the proportions of which do not allow a worthy ergonomic location, that is, a good position in relation to the body of the user. Furthermore, the complex connecting wiring of these switches results in an expensive product, as well as in difficulties for service repairs and a lack of reliability.

However, these control components had the advantage of being, until now, the most simple and the most economical solution to the problem. The known devices also had significant safety disadvantages. The fuses, even when they are lagged and sized to withstand the initial elevated ignition of current incandescent lamps, are inefficient organs for the safety of the circuits in the event of a short circuit. Furthermore, experience shows that a user who suddenly has a short circuit on the road solves the failure by replacing the fuse without trying to find the cause of the short circuit. Often, the user rapidly exhausts his fuse supply and resorts to such means as an aluminum foil paper rolled around the melted fuse or just simply a suitably dimensioned metallic part such as a nail, a screw, or a paperclip. Fortunately, most of the short circuits on a vehicle disappear with road shocks and vehicle fires are not as numerous as they could be.

Thermal circuit breakers could be a good solution if their sizing was adapted to the short-circuited current which provides a short-circuit power which is 50 to 100 times higher than the controlled normal power.

This solution is declining for economic reasons. With respect to a driver's diagnosis or information, with the exception of turn signal indicators, generalized systems which inform the driver during operation of a defect in the device are nonexistent.

SUMMARY OF THE PRESENT INVENTION

The present invention provides a circuit-diagnosis device including a continual inspection system to test for short-circuit and open-circuit conditions.

Currently, it is possible to use a microprocessor which can be programmed in such a way that it can send commands, control the execution of commands, and disengage in relation to the result of the execution according to the circumstances.

With respect to commutation of a circuit with current limitations, it is possible to use a bipolar transistor to realize this switch. Problems of circuit complexity and of energy dissipation make the use of such a device incompatible with an economical safety device. The recent availability of power MOS transistors allows consideration of devices that one may consider to be currently or imminently economical. These components offer several advantages. They provide a weak control power (very large power gain) compatible with calculator outputs. They provide for current limitation through a control voltage (Vgs), and it is possible to assemble several transistors parallel to each other without caution. Furthermore, these components offer a very good reaction to voltage overload and to high temperatures. The association of microprocessors, of power MOS transistors, and of a software system rationally using the capabilities of these components constitute the basis of the invention and solve the problems discussed above. The enclosed drawings, given by way of example, and not by way of limitation, allow a better understanding of the features of the invention.

DETAILED DESCRIPTION OF THE PREFERRED EMBODIMENT

Figure 1:
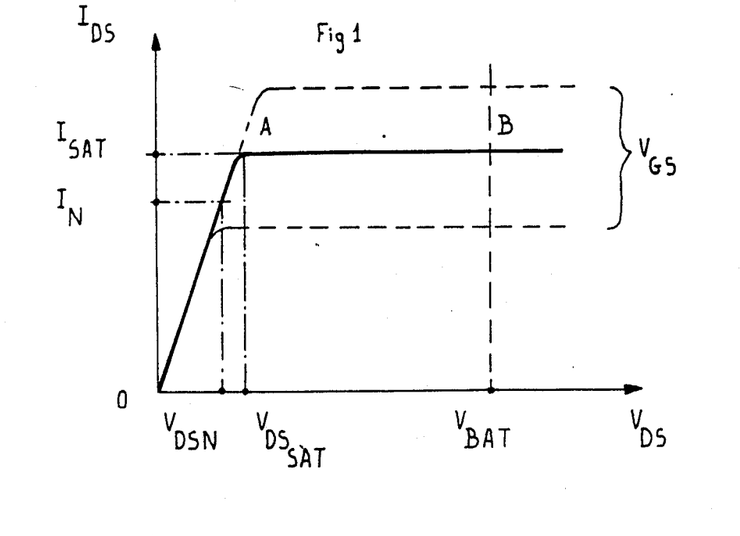
FIG. 1 illustrates the operation of a power transistor of the MOS type used in the device of the present invention.
Figure 2:
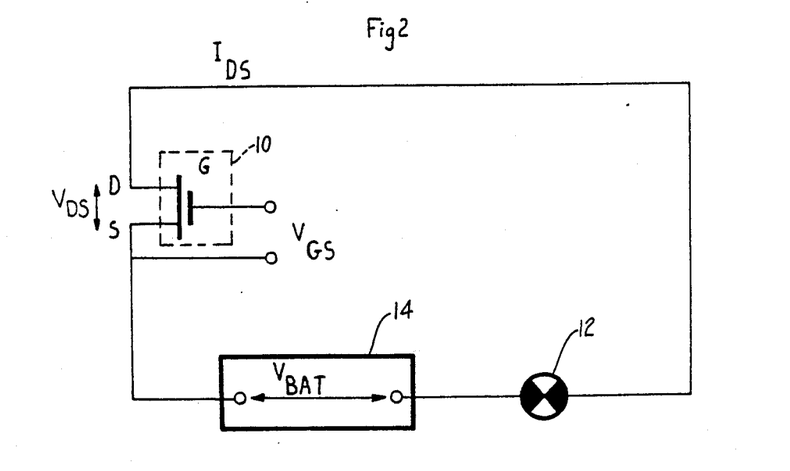
FIG. 2 graphically illustrates a circuit according to the present invention which facilitates detection of a short-circuit condition using the power MOS transistor of FIG. 1.
Figure 3:
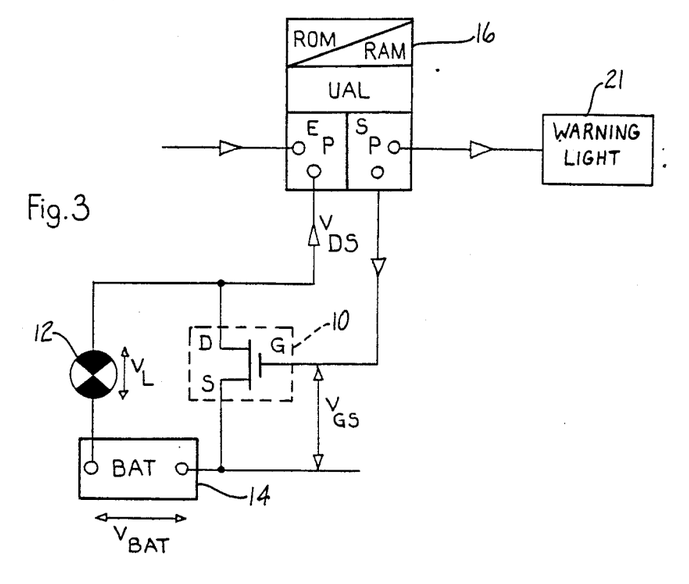
FIG. 3 illustrates a circuit according to the present invention designed to control, to inspect, and to protect a lighting system of a vehicle.
Figure 4:
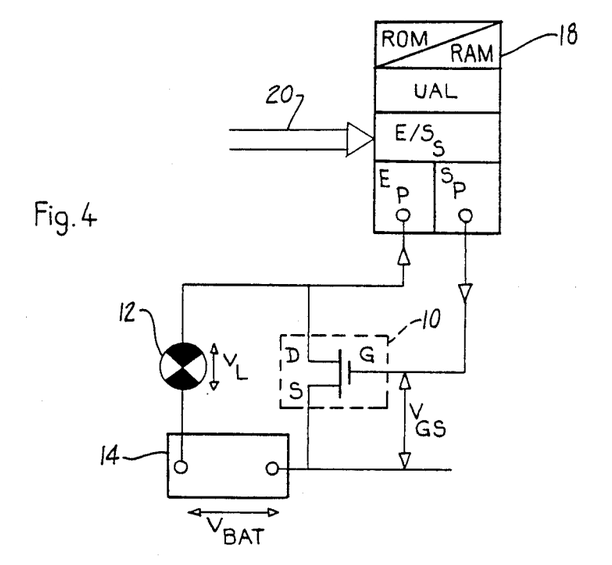
FIG. 4 illustrates a circuit similar to FIG. 3, but in which a microprocessor can communicate with other calculators or microprocessors of the vehicle.

The safety switch of the present invention is obtained by means of a power transistor 10 of the MOS type. FIG. 1 illustrates the features of this device and FIG. 2 shows a diagram of the control of a circuit including an MOS transistor 10, an incandescent lamp 12, and a storage battery 14. FIGS. 3 and 4 add a microprocessor 16 and 18, respectively, to the circuit.

The $V_{GS}$ voltage is selected so that the characteristics of the transistor are as represented by the curve illustrated in FIG. 1 as O-A-B.

The maximum current which this transistor can then conduct is $I_{SAT}$, corresponding to the curve segment A-B. The value of $I_{SAT}$ is chosen higher than $I_N$, that is, the nominal current of the lamp 12, so that during normal operation the voltage drop in the transistor 10 is very weak and equal to $V_{DSN}$ causing a dissipation of weak power in accordance to the formula $P_N = I_N \times V_{DSN}$.

In case of short circuit, the current conducted by the transistor 10 cannot be higher than $I_{SAT}$, the tested circuit downward of the MOS transistor is thus protected. The dissipated power in the transistor is then:

$$P_{CC} = I_{SAT} \times V_{BAT},$$

a higher valve than $P_N$. The transistor 10 must be chosen so as to withstand this power dissipation without damage. Ordinarily, a radiator would be necessary and this short-circuit power should be dissipated for a long period of time. But in the safety switch of the present invention, this is not the case.

The detection of the condition of the short circuit downward of the MOS power transistor 10 is obtained as indicated in FIG. 2.

If $V_{GS}$ is different from zero, the transistor 10 is conducting and voltage $V_{DS}$ must be equal to or lower than $V_{DSN}$, a value that is illustrated in FIG. 1. In the case where $V_{DS}$ is higher than $V_{DSN}$, for instance, if $V_{DS} > \frac{1}{2} B_{BAT}$, it is evident that the resistance of the transistor 10 is abnormally low. The combination of:

$$V_{GS} \neq 0 \text{ and } V_{DS} > \frac{1}{2} V_{BAT}$$

is the symptom of a short circuit which the microprocessor 16 or 18, if programmed correctly, will recognize by periodically testing the logical relation:

$$V_{GS} \neq 0 \text{ AND } V_{DS} > \frac{1}{2} V_{BAT}$$

It should be noted that $V_{GS}$ may be considered to be a command sent by the microprocessor 16 or 18 and, as a result of this, it is not necessary to reinform the microprocessor with the information $V_{GS} \neq 0$. Furthermore, it should be noted that $V_{DS} > \frac{1}{2} V_{BAT}$ is a mechanical measure requiring little precision and does not justify an analogical numerical conversion which is always costly in equipment. A logical input of the microprocessor 16 or 18 associated to a dividing bridge or to a Zener diode, not illustrated, is sufficient to obtain the information:

$$V_{DS} > \frac{1}{2} V_{BAT}.$$

Finally, in FIG. 2, the polarities of the storage battery 14 were not represented intentionally because the MOS transistor 10 can be of the type P or the type N and this allows for the two possible vehicular circuit types, positively or negatively grounded.

The characteristics of the ignition of the incandescent lamp 12 are important to the operation of the present invention.

The internal resistance of the lamp 12, when cold, is very low, and without precautions in recognition of this, the system being described would detect a short circuit at each ignition. When the microprocessor 16 or 18 sends an ignition command to a circuit supplying an incandescent lamp 12, the periodicity of the short-circuit logical tests will be extended to a time subsequent to the ignition command and this only for the circuit concerned by the recent ignition event.

A possible short circuit would be detected at the end of this extended period.

System action when a short circuit is detected:

When a short circuit has been detected, the $V_{GS}$ control of the MOS power transistor is cancelled for a time T by the microprocessor. At the end of T an ignition command will be sent again if an ignition command is still present.

At this point, two results are possible depending on whether the short-circuit condition persists. If the short circuit persists, it is detected and a new cut of the time T is issued. Ignition attempts will be issued as long as the ignition order is present. The cyclical ratio between the extended test time which is specific to the ignition and the time T is established in relation to the average power that can normally be dissipated by the MOS power transistor in the event of a short circuit. If the short circuit disappeared, operation becomes normal again with periodic tests for the presence of a possible short circuit. This disposition insures the protection of the circuit and yet restores correct operation as soon as the malfunction disappears.

Frequently, a short circuit takes place because of the intervention of a repairman, a fugitive touch under the shock of conducting elements of the circuits, or the temporary presence of a conducting liquid.

The limitation of the short-circuit current which is characteristic of the invention avoids the welding phenomena in the parts that are being touched, a phenomena which is normally observed in circuits that are not well protected. The system of the present invention systematically tests for the presence of a short circuit and, therefore, has the advantage, with regard to the above-mentioned conditions, of providing a better opportunity to conserve the operation of the controlled organ and, thus, to improve the safety of the vehicle. The circuit diagnosis and switch device of the present invention also provides for the detection of open-circuit conditions, either of the line, or the receiver, for instance, the filament of the lamp 12.

The microprocessor 16 or 18 is programmed to stop for a very short time and periodically measure the voltage $V_{GS}$ allowing the conduction of the MOS power transistor (See FIG. 2).

If $V_{GS}=0$, one must have $V_{DS}=V_{BAT}$, on the condition that drain D of the transistor be connected to the battery through the line and the receiver such as the lamp 12, in the case of FIG. 2.

If the receiver or the line are cut off, then $V_{DS} \neq V_{BAT}$.

As in the case of detection of the short circuit, it is possible to just observe that $V_{DS} > \frac{1}{2} V_{BAT}$, but the switch device can also use the complementary information which is an acceptable approximation that is sufficient for us, that is: $V_{DS} < \frac{1}{2} V_{BAT}$ is an approximation for $V_{DS}=V_{BAT}$.

If the combination of $V_{GS}=0$ and $V_{DS} < \frac{1}{2} V_{BAT}$ is checked, one will have diagnosed an open-circuit condition.

It should be noted that an alternate possibility exists. $V_{DSN}$, is zero if the circuit is cut off, because $I_{DS}=0$. Therefore, if $V_{GS} \neq 0$ and $V_{DS}=0$, an open circuit condition exists. The acquisition of $V_{DS}=0$ is delicate and requires a more complex circuit and, thus, is more costly than the one corresponding to the alternative that is described above. This second alternative is desirable, however, if the electronic interferences generated by the described system should, for particular applications, provoke difficulties.

The described system applies to receivers of the pure resistance type. In the case of inductive loads, the open-circuit test would periodically mean overloads. It is possible to remedy this difficulty by any one of several devices which may be connected between drain and the MOS power transistor and the common battery terminal. The devices may be a circuit consisting of a resistance and a series condenser, a blocking diode, or a blocking diode and a Zener diode. The latter disposition allows conservation of the rapidity of the current decrease by limiting overload to an acceptable value. Alternately, a Varactor or similar device may be used.

The choice of which of these devices is appropriate is a technical and economic problem and depends on the particular needs and constraints of the particular situation.

These devices were not illustrated in the drawing because their representation is polarized for two of them and because the drawings are a general representation covering both possible polarized assemblies. It is evident that one skilled in the art will understand how to correctly place these devices in the circuit.

The above description relates to the detection method by the microprocessor 16 or 18 of a short-circuit condition and an open-circuit condition.

The normal condition of the controlled circuit is the combination of the indications or data of NO short circuit and NO open circuit that are easy to obtain through adequate programming of the microprocessor 16 or 18.

These conditions can be reported by means of a simple warning light which is lit during normal operation of the controlled circuit. A rapidly flashing warning light indicates that the circuit is controlled, but there is a short circuit. A slowing flashing warning light indicates that the circuit is controlled, but the circuit is cut.

The driver can thus be informed of the current execution state of the orders that he sent.

The data used by the microprocessor 16 or 18 can be exploited in other devices installed on the vehicle.

FIG. 3 shows the method applied to the control, inspection, and protection of a lighting on a vehicle.

This disposition applies to a device using a monochip calculator.

The calculator or the complete microprocessor 16 consists of a program memory or ROM; a working temporary memory or RAM; an arithmetical and logical unit (microprocessor) UAL; a parallel input interface Ep; and a parallel output interface Sp.

To solve the case of a single receiver, it is necessary to have two parallel inputs and two parallel outputs. An input command, that is, a command is sent by the vehicle driver through a switch. A detection input corresponding to $V_{DS} > \frac{1}{2} V_{BAT}$ is generated by the circuit itself. A control output $V_{GS}$ is provided for the transistor MOS. Finally, output data is sent to a warning light for the driver.

Alternately, in the case when N receivers are controlled by the same switch according to a sequential method, additional inputs would be needed. N detection inputs corresponding to $V_{DS} > \frac{1}{2} V_{BAT}$ are also needed. Thus, a total of N+2 parallel inputs are needed. Furthermore, additional outputs are needed. These additional outputs may include individual data on inspection and return of N, separate inspection and N control outputs $V_{GS}$ of the MOS transistor or a total of 2N outputs. Alternately, only one inspection signal may be generated for a total of N+1 outputs.

For N receivers, the following chart summarizes the inputs I and outputs O which are used.

|  | Individual inspection data | | Collective inspection data | |
| --- | --- | --- | --- | --- |
| Order | I | O | I | O |
| Individual | 2 N | 2 N | 2 N | N + 1 |
| Sequential | N + 2 | 2 N | N + 2 | N + 1 |

Those skilled in the art will notice that the calculator or monochip microprocessor required to carry out the present invention can be better utilized by the adoption of sequential controls step by step every time that this disposition is not compatible with the application in question, such as vehicle lighting, windshield-wipers with several speeds, and electrical idler.

FIG. 4 is not different from FIG. 3 except for the microprocessor 18 being used, which is also a monochip calculator, but additionally has a series input and output interface 20 allowing it to talk with the other calculators installed on the vehicle.

In this case, for N receivers, the parallel inputs and outputs would be:

| Receiver | Inputs | Outputs |
| --- | --- | --- |
| N | N | N |

In the context of the evolution of vehicle electronic equipment, one can go from the solution of FIG. 3 to the solution of FIG. 4.

Figure 5:
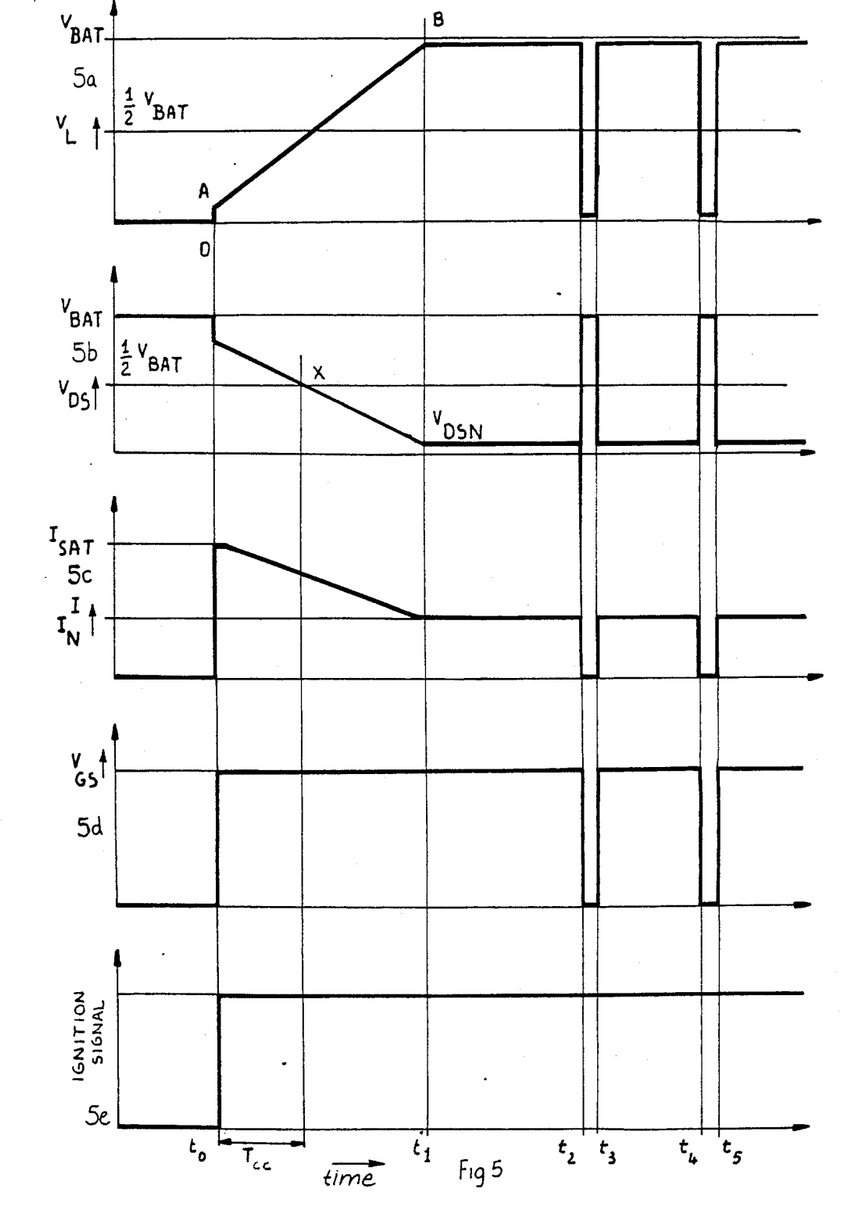
FIG. 5 is a diagrammatic view graphically illustrating the normal operation of the device of the present invention.

Operation in a normal situation is as illustrated in FIG. 5 which illustrates, in relation to time, the appearance of the ignition order of the lamp starting from a predetermined starting time $t_o$.

Diagram 5$d$ illustrates, in relation to time, a MOS power transistor control signal sent by the microprocessor 16 or 18. There are interruptions from a second predetermined time $t_2$ to a third predetermined time $t_3$ and from a fourth predetermined time $t_4$ to a fifth predetermined time $t_5$, separated by the recurrence period from time $t_3$ to time $t_4$, which facilitates diagnosing possible discontinuities of the circuit.

Diagram 5$c$ illustrates the current I in the circuit, which is limited to a maximum value of $I_{SAT}$. At time $t_o$ voltage is applied to the lamp by the MOS power transistor and the current begins to flow. At the end of a time interval from time $t_o$ to the first predetermined time $t_1$, the lamp filament will have achieved its balance temperature and the current becomes stable at its nominal value $I_N < I_{SAT}$.

Finally, during open-circuit tests, the current is cancelled during the time period from time $t_2$ to time $t_3$.

Times $t_2$, $t_3$ and $t_4$ are chosen in such a way that the average value of the current is almost unaffected and such that no flashing of the lamp can be detected, even for the weakest thermal inertia lamp.

Diagram 5$b$ illustrates the voltage $V_{DS}$ of the MOS power transistor 10.

The voltage $V_{DS}$ allows the dissipated energy and power to be completed.

The short-circuit test is done at the first ignition in the time $T_{cc}$, after time $T_o$, at X in FIG. 5$b$ when $V_{DS} < \frac{1}{2} V_{BAT}$.

One skilled in the art will note that $V_{DSN}$ may be a fraction of Volt.

This is a characteristic of the MOS transistor 10 which is very favorable to the conservation of the receiver performances and also reduces the sizes of radiators required by switch transistors for power dissipation.

Diagram 5$a$ illustrates the voltage $V_L$ at the terminals of the lamp in relation to time. Diagram 5$a$ is the complement of Diagram 5$b$ since $V_L + V_{DS} = V_{BAT}$. It should be noted that at time $t_o V_L = I_{SAT} \times R_F$, with $R_F$ being the resistance in the cold state of the lamp filament.

From A to B, the lamp filament is heated until it reaches its equilibrium operation temperature.

The open-circuit tests appear as cancellations of $V_L$ when the circuit is closed.

Figure 6:
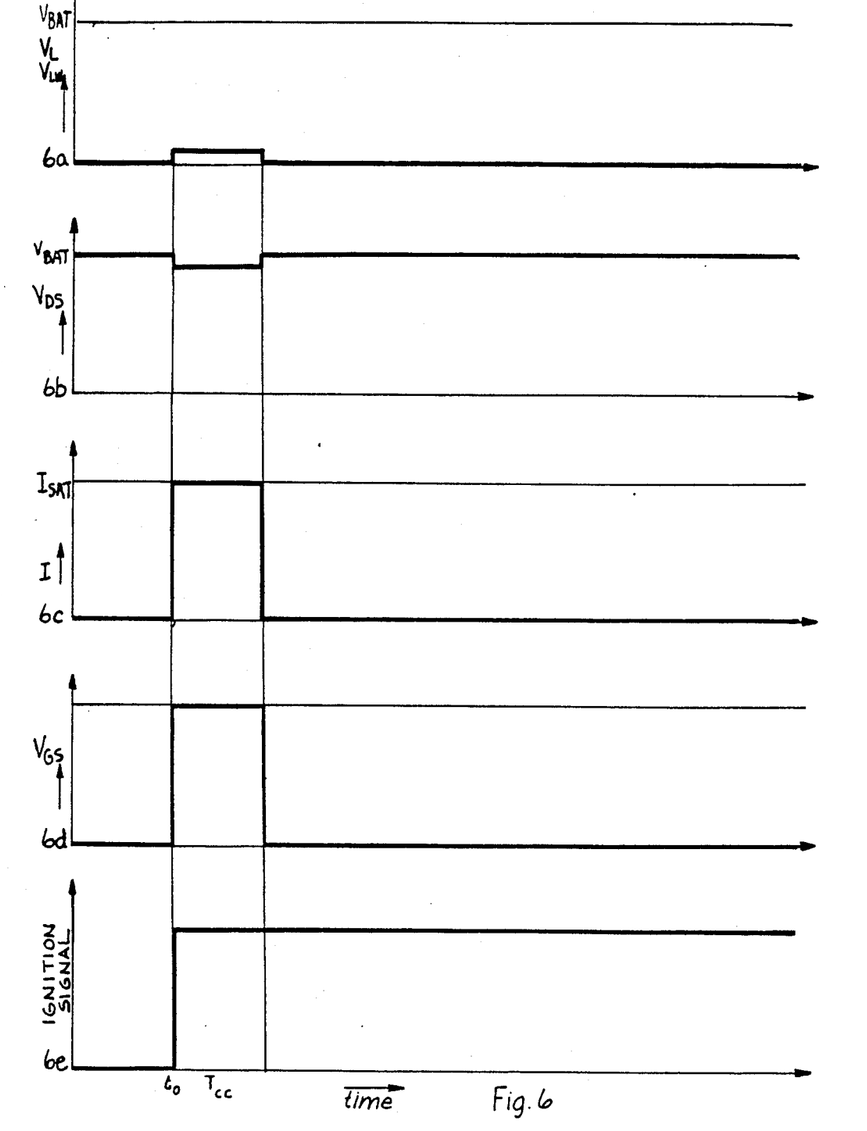
FIG. 6 is a diagrammatic view similar to FIG. 5 but illustrating the operation of the safety switch of the present invention during a short circuit.

In the case of a short circuit, the operation of the circuit diagnosis and control device is as illustrated in FIG. 6. It should be noted as shown in Diagram 6$a$, that during the ignition test period, voltage $V_L$ reaches a weak value defined by the short-circuit resistance and the MOS transistor saturation current.

At the end of time $T_{cc}$, $V_{DS} \frac{1}{2} V_{BAT}$, the short circuit is detected and one cancels $V_{GS}$ and afterwards $I_{SAT}$.

At the end of a certain length of time, and if ignition command 5$e$ is still active, one will again test the circuit.

Figure 7:
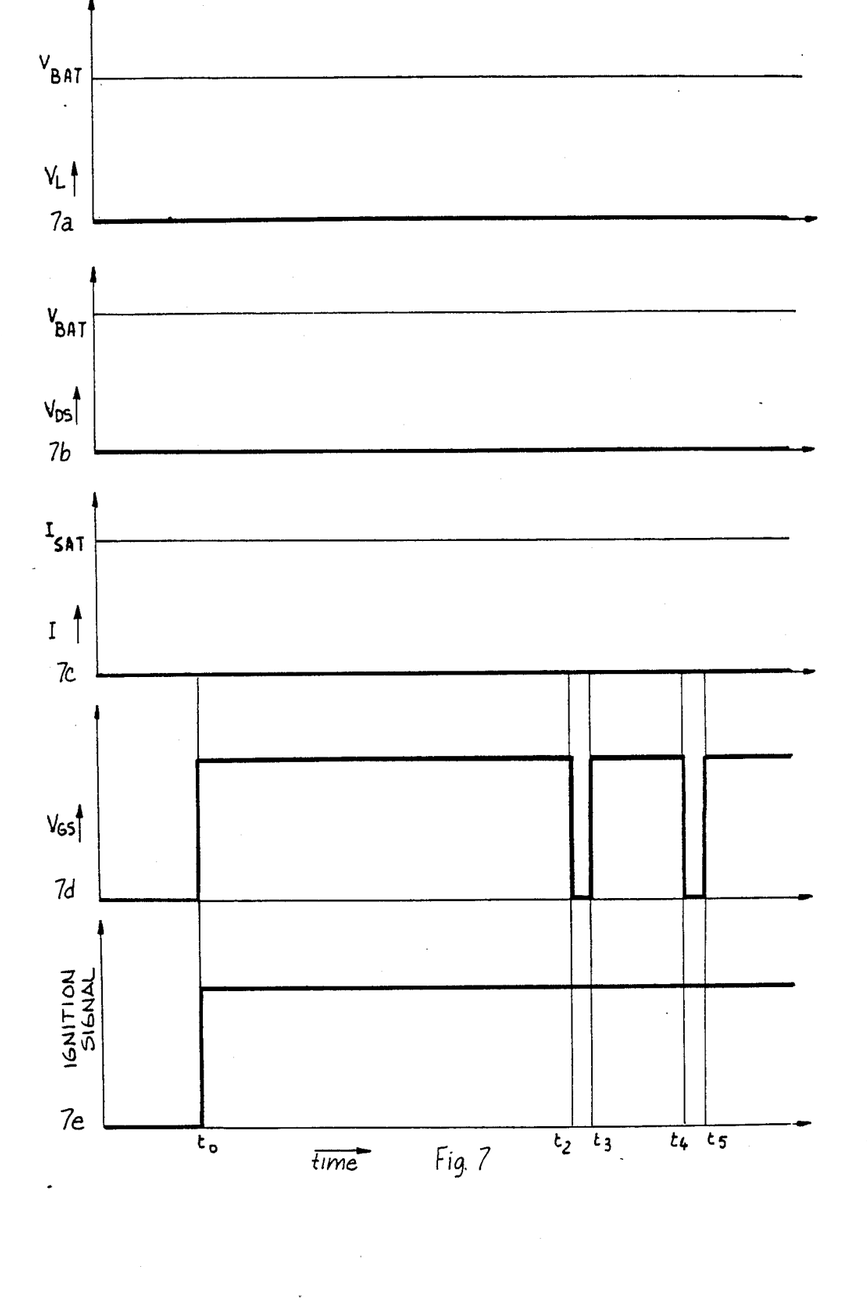
FIG. 7 is a similar diagrammatic view illustrating the operation of the safety switch of the present invention during an open-circuit condition.

In the case of an open circuit, operation is illustrated in FIG. 7. As shown in Diagrams 7$a$, 7$b$ and 7$c$, each of $V_L$, $V_{DS}$, and I remain zero and the open circuit is detected.

Clearly, the assembly may consist of several inspection circuits of the abovementioned type, at the head of which a control selector allows the user to choose the circuit to be tested. On a vehicle, one of these circuits may correspond to the headlight inspection, another to the inspection of parking lights, and still another to the load circuit inspection of the battery.

The above constitutes a description of the best mode contemplated by the inventor at the time of filing for carrying out the present invention. Variations and modifications therefrom will be apparent to those skilled in the art and are included in the intended scope of the claims appended hereto.

What is claimed as novel is as follows:

1. A control, inspection and safety device in an electrical circuit receiving electrical power from a direct current source, comprising:

a MOS power transistor having a source and a drain connected in series between said current source and said electrical circuit, and a gate, said MOS power transistor being selected such that the drain to source saturation current $I_{SAT}$ is higher than the current corresponding to the nominal current of said electrical circuit; and a microprocessor having means for applying a gate to source voltage $V_{GS}$ to said gate to render said MOS transistor conductive in response to an external command and to periodically test a first logical relation:

$$V_{GS} \neq 0$$

and $$V_{DS} > \tfrac{1}{2} V_{BAT}$$

to generate a first signal indicative of a short circuit condition in said electrical circuit when said first logical relation is satisfied where $V_{DS}$ is the voltage between said drain and said source of said MOS transistor and $V_{BAT}$ is the nominal voltage at the terminals of said current source, said microprocessor further having means for terminating the application of said gate to source voltage $V_{GS}$ to said gate for a first predetermined period of time in response to each time the test of said first logical relationship is satisfied and means responsive to the expiration of said first predetermined period of time for reapplying said voltage $V_{GS}$ to said gate and to retest said first logical relationship.

2. The control, inspection and safety device of claim 1, wherein said microprocessor further includes means for periodically terminating said voltage $V_{GS}$ applied to said gate to render said MOS transistor nonconductive to test a second logical relation $V_{GS}=0$, and $V_{DS}>\frac{1}{2}V_{BAT}$ and to generate a second signal indicative of an open circuit condition when said second logical condition is not satisfied.

3. The control, inspection and safety device of claim 1, wherein said microprocessor is connected to at least one warning light, said warning light being regulated by said miroprocessor to be continuously lit during normal operation of said electrical circuit; to be lit and slowly flashing when there is a short circuit condition in response to said first signal; and to be lit and rapidly flashing when there is an open circuit condition in response to said second signal.

4. The control, inspection and safety device of claim 1 further comprising at least two of said electrical circuits and said external command identifies which of said at least two electrical circuits is to be energized, said control, inspection and safety device having control means having one of said MOS transistor connected in series between said current source and each of said at least two electrical circuits, so that each of said at least two electrical circuits has its own MOS transistor, and means responsive to an external command for selectively applying said voltage $V_{GS}$ to the gate of said MOS transistor connected to the one of said at least two electrical circuits identified by said external command.

5. A circuit diagnosis and control device which detects short circuit conditions in a primary circuit receiving electrical power from a direct current power source and for temporarily discontinuing current to said primary circuit in the event of a short circuit, said circuit diagnosis and control device comprising:

a MOS power transistor having a source and a drain electrode connected in series between said power source and said primary circuit and a gate electrode; and a microprocessor interconnected with said MOS power transistor to periodically test said MOS power transistor to detect a short circuit condition in said primary circuit and adapted to temporarily discontinue current to said primary circuit upon detection of a short circuit condition, said microprocessor having means for generating a voltage $V_{GS}$ applied between said gate and source electrodes of said power transistor rendering said MOS power transistor conductive in response to an external command and means for periodically testing a first logical relationship:

$V_{GS} \neq 0$ and $V_{DS} > \frac{1}{2} V_{BAT}$ indicative of a short circuit condition where $V_{DS}$ is the voltage difference between said drain and source electrodes and $V_{BAT}$ is the nominal voltage of the power source, said microprocessor further having means for temporarily terminating the application of said voltage $V_{GS}$ between said gate and source electrodes rendering said MOS power transistor nonconductive in response to each time said first logical relationship is satisfied and means used in reapplying said voltage $V_{GS}$ between said gate and source electrodes after a predetermined period of time.

6. The circuit diagnosis and control device of claim 5 wherein said MOS power transistor is selected such that the current intensity limitation for the current between the drain and the source electrode of said MOS power transistor is higher than the normal nominal intensity of said primary electrical circuit.

7. The circuit diagnosis and control device of claim 5 wherein said microprocessor has means for reapplying said voltage $V_{GS}$ to said gate as long as said external command exists and for retesting said first logical relationship for a short circuit condition a predetermined time after said voltage $V_{GS}$ is terminated in response to said first logical relationship being satisfied.

8. The circuit diagnosis and control device of claim 5 wherein said microprocessor further includes means for detecting an open circuit condition.

9. The circuit diagnosis and control device of claim 8 wherein said microprocessor is interconnected with a warning light, said microprocessor being adapted to regulate said warning light such that said warning light is continuously lit when said primary circuit is functioning normally, is lit and slowing flashing when said microprocessor has detected a short circuit condition and is lit and rapidly flashing when said microprocessor has detected an open circuit condition.

10. The circuit diagnosis and control device of claim 8 wherein said means for detecting an open circuit condition comprises means for temporarily terminating the voltage $V_{GS}$ applied to said MOS power transistor and means for testing a second logical relationship:

$V_{GS}=0$ and $V_{DS} \leq \frac{1}{2} V_{BAT}$ to detect said open circuit condition of the primary circuit when said second logical relationship is satisfied.

11. A method used in protecting a primary circuit having a direct current power source from damage resulting from a short circuit condition, said method comprising the steps of:

connecting the drain and source of a power MOS transistor in series between said power source and said primary circuit;

generating a voltage $V_{GS}$ in response to an external command to energize said primary circuit;

applying said voltage $V_{GS}$ between the gate and source of said MOS transistor to render said MOS transistor conductive;

comparing the voltage drop $V_{DS}$ between said drain and source of said MOS transistor with a reference voltage having a value equal to approximately $\frac{1}{2}$ of the nominal voltage of said power source to generate a short circuit signal indicative of a short circuit condition in said primary circuit when said voltage drop $V_{DS}$ is greater than said reference voltage;

terminating the application of said voltage $V_{GS}$ to said gate for a predetermined period of time in response to said short circuit signal to render said MOS transistor nonconductive and terminating the application of electrical power from said power source to said primary circuit;

reapplying said voltage $V_{GS}$ to said gate in response to the expiration of said predetermined time period; and repeating said steps of comparing through said step of reapplying each time said voltage $V_{GS}$ is applied to said gate and at predetermined intervals thereafter when no short circuit signal is generated as long as said external command is present.

12. The method of claim 11 wherein said method is applied to testing at least two primary circuits and said external command identifies which of said at least two primary circuits is to be energized, said method further comprising the steps of:

connecting the drain and source of a power MOS transistor in series between said power source and each of said at least two primary circuits so that each of said at least two primary circuits has its own MOS transistor connecting it to said power source; and said step of applying said voltage $V_{GS}$ between the gate and source of said MOS transistor applies the voltage $V_{GS}$ between the gate and the source of said MOS transistor associated with the primary circuit identified by the external command.

13. The mthod of claim 11 further comprising the steps of:

periodically terminating the application of the voltage $V_{GS}$ to said gate of said MOS transistor to render said MOS transistor nonconductive; and comparing said voltage drop $V_{DS}$ between said drain and source of said MOS power transistor with said reference voltage each time the application of voltage $V_{GS}$ to said gate is terminated to generate an open circuit signal indicative of an open circuit condition in said primary electrical circuit when said voltage drop $V_{DS}$ is less than said reference voltage.

14. The method of claim 13 wherein said MOS power transistor is selected such that the current capabilities between the drain and the source of said MOS transistor is higher than the nominal current of said primary electrical circuit.

* * * * *

UNITED STATES PATENT AND TRADEMARK OFFICE
CERTIFICATE OF CORRECTION

PATENT NO. : 4,694,372
DATED : September 15, 1987
INVENTOR(S) : Jean-Paul Sibeud It is certified that error appears in the above-identified patent and that said Letters Patent is hereby corrected as shown below:

Column 3, line 68, delete "°" and insert a period ---- ----.

Column 8, line 18, delete "$V_{DS}\frac{1}{2}V_{BAT}$," and insert ---- $V_{DS} \frac{1}{2} V_{BAT}$, ----.

Signed and Sealed this

Thirty-first Day of May, 1988

Attest:

DONALD J. QUIGG

Attesting Officer

Commissioner of Patents and Trademarks